(12) United States Patent
Gong et al.

(10) Patent No.: US 12,057,457 B2
(45) Date of Patent: Aug. 6, 2024

(54) DISPLAY SUBSTRATE, PREPARATION METHOD THEREOF, AND DISPLAY PANEL

(71) Applicants: Hefei BOE Optoelectronics Technology Co., Ltd., Hefei (CN); BOE Technology Group Co., Ltd., Beijing (CN)

(72) Inventors: Kui Gong, Beijing (CN); Xianxue Duan, Beijing (CN); Haifeng Cui, Beijing (CN); Tianzhen Liu, Beijing (CN); Zhihai Zhang, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/418,218

(22) PCT Filed: Dec. 29, 2020

(86) PCT No.: PCT/CN2020/140796
§ 371 (c)(1),
(2) Date: Sep. 10, 2021

(87) PCT Pub. No.: WO2021/174977
PCT Pub. Date: Sep. 10, 2021

(65) Prior Publication Data
US 2024/0014225 A1    Jan. 11, 2024

(30) Foreign Application Priority Data

May 3, 2020 (CN) .......................... 202010146623.5

(51) Int. Cl.
*H01L 27/12* (2006.01)
*G02F 1/1368* (2006.01)

(52) U.S. Cl.
CPC ........ *H01L 27/1248* (2013.01); *H01L 27/127* (2013.01); *G02F 1/1368* (2013.01)

(58) Field of Classification Search
None
See application file for complete search history.

(56) References Cited

U.S. PATENT DOCUMENTS 10,446,791 B2    10/2019   Harada
2005/0158981 A1   7/2005   Chang et al.
(Continued)

FOREIGN PATENT DOCUMENTS

CN         1773356 A      5/2006
CN       101504950 A      8/2009
(Continued)

OTHER PUBLICATIONS

CN202010146623.5 first office action.
CN202010146623.5 second office action.

*Primary Examiner* — Bo B Jang
(74) *Attorney, Agent, or Firm* — IPro, PLLC

(57) ABSTRACT

The present disclosure relates to the field of display technology, and discloses a display substrate, a preparation method thereof, and a display panel, used for improving the structure of the display substrate, improving characteristics of a thin film transistor, and increasing the yield of a display product. The display substrate includes: a base substrate; a thin film transistor on the base substrate; and a flattening layer on a side, away from the base substrate, of the thin film transistor, wherein the flattening layer is provided with a groove around a channel area of the thin film transistor, and an orthographic projection of the groove on the base substrate is not overlapped with an orthographic projection of the channel area on the base substrate.

16 Claims, 6 Drawing Sheets

(56) References Cited

U.S. PATENT DOCUMENTS

| | | |
|---|---|---|
| 2006/0186409 A1 | 8/2006 | Horino et al. |
| 2009/0200931 A1 | 8/2009 | Takei et al. |
| 2012/0181525 A1 | 7/2012 | Sugimoto et al. |
| 2017/0345883 A1 | 11/2017 | Song et al. |
| 2018/0337365 A1 | 11/2018 | Harada |
| 2020/0058720 A1 | 2/2020 | Kajiyama et al. |

FOREIGN PATENT DOCUMENTS

| | | |
|---|---|---|
| CN | 102511199 A | 6/2012 |
| CN | 106067471 A | 11/2016 |
| CN | 107452772 A | 12/2017 |
| CN | 111341849 A | 6/2020 |

DISPLAY SUBSTRATE, PREPARATION METHOD THEREOF, AND DISPLAY PANEL

CROSS-REFERENCES TO RELATED DISCLOSURE

The present disclosure is a National Stage of International Application No. PCT/CN2020/140796, filed on Dec. 29, 2020, which claims the priority to Chinese Patent Application No. 202010146623.5, filed with the China National Intellectual Property Administration on Mar. 5, 2020, the content of which are incorporated herein by reference in their entirety.

FIELD

The present disclosure relates to the field of display technology, in particular to a display substrate, a preparation method thereof, and a display panel.

BACKGROUND

A thin film transistor (TFT) can be used as a pixel switching element of a flat panel display. An active layer of the thin film transistor can be mainly formed by amorphous silicon or polycrystalline silicon. The amorphous silicon active layer is easily deposited on a large area and easily machined at low temperature, but has the defect of a low carrier migration rate. The polycrystalline silicon active layer has excellent electrical properties due to a high carrier migration rate, but needs to be machined at high temperature, and has low reliability.

An oxide semiconductor (such as IGZO) is used as the active layer of the thin film transistor, and can have the advantages of machining at high temperature of the amorphous silicon and the high migration rate of the polycrystalline silicon. However, component characteristics of the oxide semiconductor active layer are easily affected by following processes, so that the performance of the TFT is poor, and then a display product is poor.

SUMMARY

The present disclosure discloses a display substrate, a preparation method thereof, and a display panel, which aim at improving a structure of the display substrate, improving characteristics of a thin film transistor, and increasing a yield of a display product.

A display substrate, includes:
a base substrate;
a thin film transistor on the base substrate; and
a flattening layer on a side, away from the base substrate, of the thin film transistor, provided with a groove around a channel area of the thin film transistor, wherein an orthographic projection of the groove on the base substrate is not overlapped with an orthographic projection of the channel area on the base substrate.

Optionally, the groove is an annular groove surrounding the channel area.

Optionally, the groove includes a plurality of sections of groove bodies which surround the channel area and are sequentially arranged at intervals, and the plurality of sections of groove bodies are sequentially adjacent end to end without connecting with each other.

Optionally, the groove is a blind groove with a depth smaller than a thickness of the flattening layer.

Optionally, the groove is a through groove penetrating through the flattening layer in a thickness direction of the flattening layer.

Optionally, the groove includes an annular body portion and a plurality of protruding portions protruding relative to a side wall of the annular body portion, and an orthographic projection of the protruding portions on the base substrate is on a side, facing an orthographic projection of the channel area on the base substrate, of an orthographic projection of the annular body portion on the base substrate.

Optionally, the thin film transistor includes source and drain electrodes, and the flattening layer further includes a first via hole for exposing the source and drain electrodes; the groove communicates with the first via hole, and a size of the first via hole is larger than a width of the groove.

Optionally, the width of the groove is 1 μm to 3 μm.

Optionally, the display substrate, further includes:
a first electrode layer on a side, away from the base substrate, of the flattening layer, wherein the first electrode layer includes a first portion in the groove, and the first portion covers a bottom of the groove and exposes a side wall of the groove; and
a first inorganic insulating layer on a side, away from the base substrate, of the first electrode layer, wherein the first inorganic insulating layer covers the bottom and the side wall of the groove.

Optionally, an angle of gradient of the side wall of the groove is larger than 80 degrees.

A display panel includes the display substrate, wherein the groove is in a non-open area of the display panel.

A preparation method of a display substrate, includes:
preparing a thin film transistor on a base substrate; and
preparing a flattening layer on the thin film transistor, wherein the flattening layer is provided with a groove around a channel area of the thin film transistor, and an orthographic projection of the groove on the base substrate is not overlapped with an orthographic projection of the channel area on the base substrate.

Optionally, the preparing the flattening layer on the thin film transistor, further includes:
coating the thin film transistor with an organic resin layer;
forming an annular blind groove surrounding the channel area of the thin film transistor in the organic resin layer through an exposure and development process, wherein a ratio of a depth of the blind groove to a thickness of the organic resin layer is larger than 1/2; and
treating the organic resin layer through an ashing process, so that the blind groove becomes a through groove penetrating through the organic resin layer in a thickness direction of the organic resin layer.

Optionally, the preparing the thin film transistor on the base substrate, further includes:
sequentially preparing an active layer and source and drain electrodes on the base substrate;
the preparing the flattening layer on the thin film transistor, further includes:
forming the blind groove in the organic resin layer through the exposure and development process, and meanwhile forming a first via hole for exposing the source and drain electrodes in the organic resin layer, wherein a ratio of a width of the blind groove to a size of the first via hole ranges from 1/10 to 1/2.

Optionally, the treating the organic resin layer through the ashing process, further includes:

etching the organic resin layer by plasma etching equipment through bombardment with $O_2$ as working gas so as to remove organic resin layer residues at the bottom of the blind groove.

Optionally, after the preparing the flattening layer on the thin film transistor, the method further includes:

preparing a first electrode layer on the flattening layer through magnetron sputtering, wherein the first electrode layer includes a first portion in the groove, and the first portion covers a bottom of the groove and exposes a side wall of the groove.

Optionally, after the preparing the first electrode on the flattening layer through magnetron sputtering, the method further includes:

preparing an inorganic insulating layer on the first electrode layer through a plasma enhanced chemical vapor deposition (PECVD) mode, wherein the inorganic insulating layer covers the bottom and the side wall of the groove.

DETAILED DESCRIPTION OF THE EMBODIMENTS

Currently, in the actual manufacturing process for an oxide semiconductor thin film transistor (such as IGZO TFT), a switching voltage Vth is usually low and does not reach an expected value due to influences of various factors, so that trust on the oxide semiconductor thin film transistor is negatively affected. One important factor affecting the switching voltage Vth of the TFT is an organic insulating film layer.

The organic insulating film layer is widely applied to TFT array substrates of high-end products due to advantages of a small dielectric constant, good surface flatness and the like, on one hand, the organic insulating film layer can prevent external water vapor and the like from invading so as to protect a TFT back groove; and on the other hand, exhaust gas (Outgas) such as water vapor released in the high-temperature manufacturing process for the organic insulating film layer also can seriously affect the device characteristics of the TFT. For example, an inventor of the present disclosure finds that reductive gas (Outgas) such as water vapor is released in a high-temperature annealing technological process for the organic insulating film layer and a following electrode layer high-temperature annealing process, the gas is released outside and also diffuse downwards to permeate into an active layer groove of the TFT, and therefore a transfer characteristic curve of the TFT deviates rightwards overall, and even the TFT directly shows a semiconductor tendency.

In view of above problems, the embodiments of the present disclosure disclose a display substrate, a preparation method thereof, a display panel, and a display device, which aim at improving a structure of the display substrate, reducing influences of gas (Outgas) released in the high-temperature manufacturing process for an organic insulating film layer on device characteristics of an IGZO TFT, then improving characteristics of the thin film transistor, and increasing a yield of a display product.

The technical solutions of the embodiments of the present disclosure are clearly and completely described below in combination with drawings of the embodiments of the present disclosure, and obviously, the described embodiments are part of embodiments of the present disclosure, but are not all the embodiments. Based on the embodiments of the present disclosure, all the other embodiments obtained by those of ordinary skill in the art without creative labor belong to the protection scope of the present disclosure.

Figure 1:
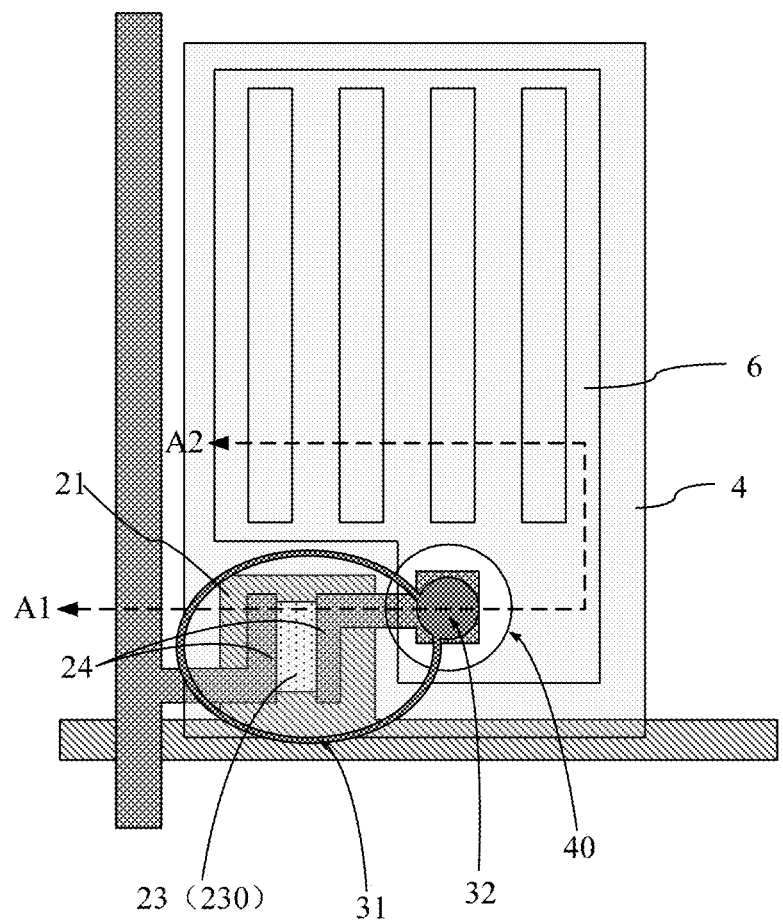
FIG. 1 is a schematic diagram of part of a plane structure of a display substrate provided by one embodiment of the present disclosure.
Figure 2:
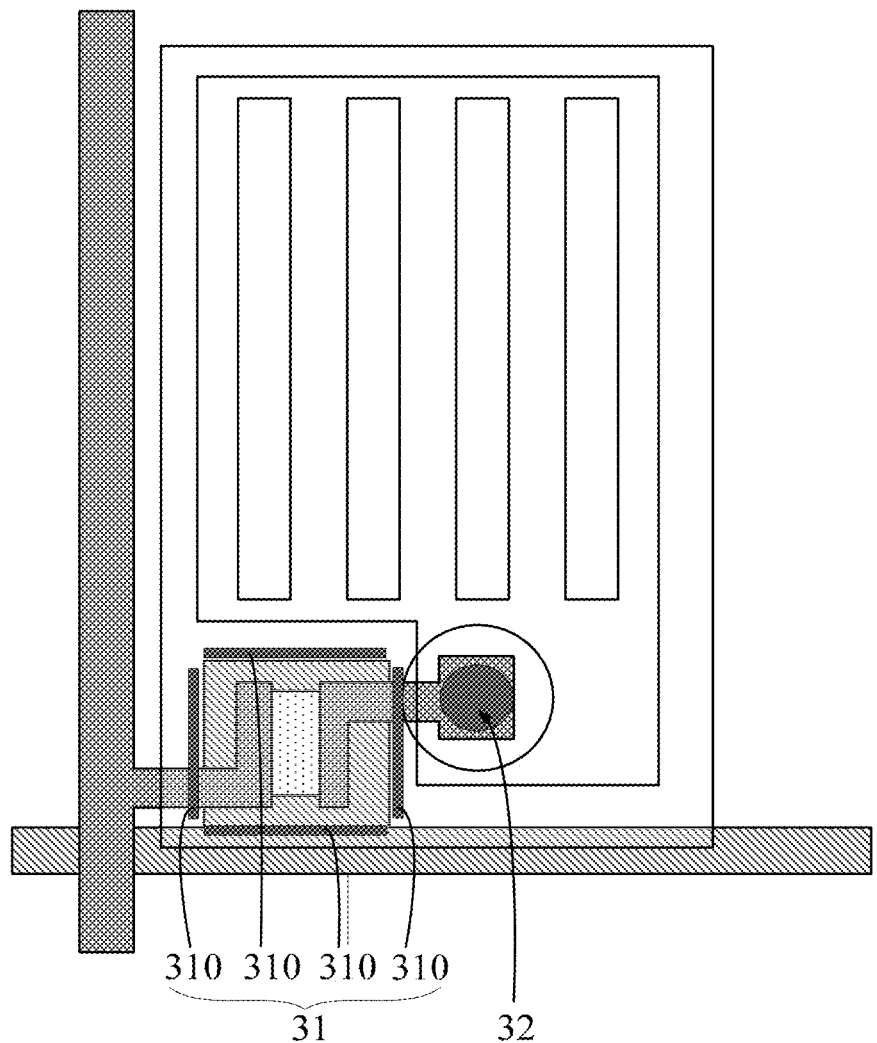
FIG. 2 is a schematic diagram of part of a plane structure of a display substrate provided by another embodiment of the present disclosure.
Figure 3:
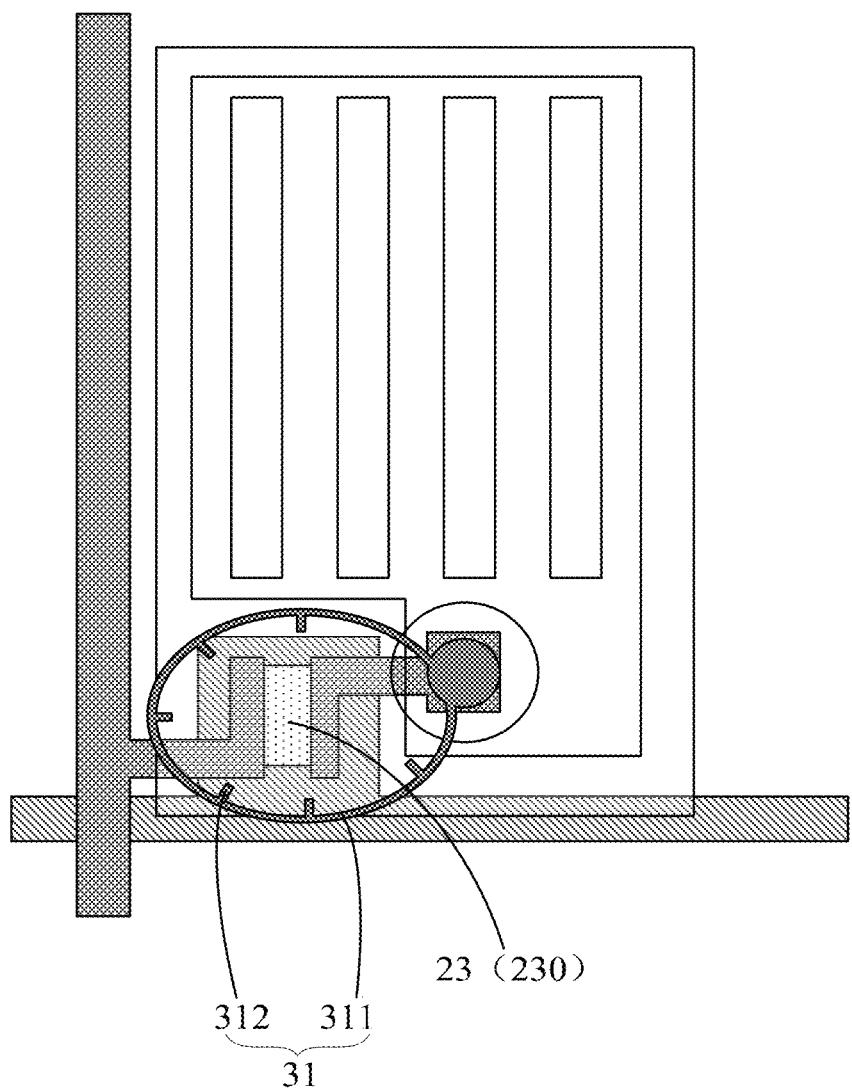
FIG. 3 is a schematic diagram of part of a plane structure of a display substrate provided by yet another embodiment of the present disclosure.
Figure 4:
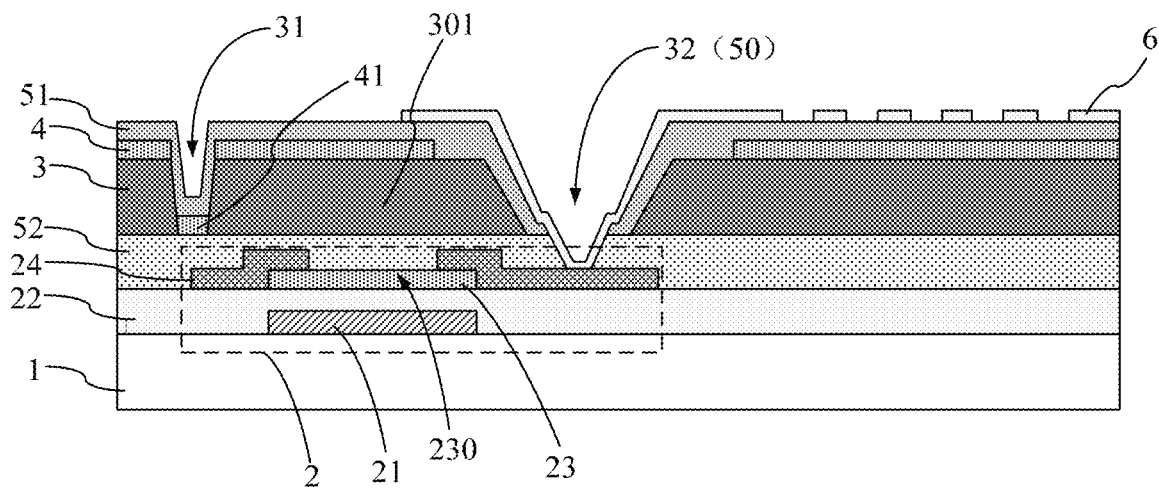
FIG. 4 is a schematic diagram of part of a cross-section structure of the display substrate in FIG. 1 in an A1-A2 direction.

FIG. 1-FIG. 3 are plane schematic diagrams of one pixel area of a display substrate, and FIG. 4 is a section schematic structural diagram of FIG. 1 in an A-A direction. Specifically, FIG. 1 to FIG. 3 only schematically show part of film layers, such as a gate electrode 21, an active layer 23, source and drain electrodes 24, a first electrode layer 4 and a pixel electrode 6 and further schematically draw a groove 31 and a first via hole 32 in a flattening layer, an opening 40 in the first electrode layer 4 and other structures, but in order to guarantee a clear effect of graphs, the flattening layer, a first inorganic insulating layer, a second inorganic insulating layer and other film layers are not specifically shown in the figures, and specifically, the film layers involved in FIG. 1 to FIG. 3 and a positional relationship between the film layers can refer to the section diagram of FIG. 4.

As shown in FIG. 1 to FIG. 4, the embodiment of the present disclosure provides a display substrate, includes:

a base substrate 1;
a thin film transistor 2 on the base substrate; and
a flattening layer on a side, away from the base substrate, of the thin film transistor and provided with a groove around a channel area of the thin film transistor, wherein an orthographic projection of the groove on the base substrate is not overlapped with an orthographic projection of the channel area on the base substrate.

In the above display substrate, the flattening layer 3 is above the thin film transistor (TFT) 2, and the flattening layer 3 can prevent external water vapor and the like from invading so as to protect a channel area 230 of the TFT 2; the flattening layer 3 is provided with the groove 31 around the channel area 230 of the TFT 2, the flattening layer 3 releases reductive gas (Outgas) such as water vapor in a high-temperature annealing process for the flattening layer 3 and/or a high-temperature annealing process for an electrode layer (such as the first electrode layer 4) above the flattening layer 3, paths allowing the gas (Outgas) to be released outside can be increased through the groove 31, and the Outgas is prevented from diffusing downwards into the channel area 230 of the oxide TFT 2 to degrade characteristics of the TFT 2; and meanwhile, the orthographic projection of the groove 31 is not overlapped with the orthographic projection of the channel area 230 of the TFT 2, in other words, a position over the channel area 230 of the TFT 2 is still covered with a complete organic flattened film layer for protection, and therefore protection of the flattening layer 3 on the channel area 230 of the TFT 2 cannot be affected through the arrangement of the groove 31.

Based on the above, in the display substrate, by means of the groove structure in the flattening layer above the thin film transistor (TFT), influences of gas (Outgas) released in the high-temperature manufacturing process for the organic flattening layer on the device characteristics of the TFT can be reduced, then the device characteristics of the TFT are improved, and the yield of a display product is increased.

In some embodiments, as shown in FIG. 1 and FIG. 3, the groove may be an annular groove surrounding the channel area 230.

Exemplarily, the annular groove may be a closed ring groove, and also may be an open ring groove.

As shown in FIG. 1 and FIG. 4, the flattening layer can be divided into an independent portion 301 covering the channel area 230 and a surrounding portion surrounding the independent portion 301 by the annular groove 31, and the independent portion 301 and the surrounding portion are separated by the annular groove 31, so that water vapor generated in the high-temperature manufacturing process for the surrounding portion to the independent portion 301 and the channel area 230 can be avoided. An area of the independent portion is small, the water vapor generated in the high-temperature manufacturing process for it is little, and the generated water vapor can diffuse outside through the annular groove 31, so that the water vapor diffusing to the channel area 230 is very little, and the water vapor hardly affects the channel area 230.

In some other embodiments, as shown in FIG. 2, the groove 31 may include a plurality of sections of groove bodies (such as strip-shaped grooves 310 in the figure) which surround the channel area 230 and are sequentially arranged at intervals, and specifically, the plurality of sections of groove bodies are sequentially adjacent end to end but not connected with each other.

The plurality of sections of groove bodies surround the channel of the TFT, the shapes of the groove bodies are not limited, and the groove bodies may be round, oval, square, strip-shaped and the like specifically. For example, as shown in FIG. 2, the groove 31 include a plurality of sections of strip-shaped grooves 310 formed at intervals, the plurality of sections of strip-shaped grooves 310 are sequentially arranged around the channel area and adjacent end to end but not connected with each other, and each section of strip-shaped groove stretches around the channel area.

Exemplarily, the groove 31 annularly surrounds the channel area 230, specifically may surround the channel area 230 in a circular ring shape, and also may surround the channel area 230 in an oval shape (shown in FIG. 1 and FIG. 3) or in a square ring shape (shown in FIG. 2), which is not limited herein.

Figure 6:
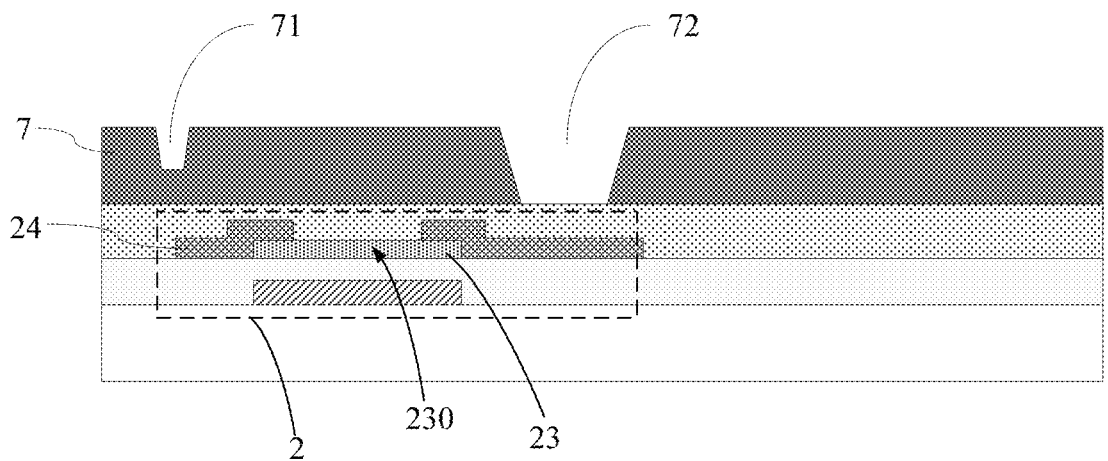
FIG. 6 is a schematic diagram of part of a cross-section structure of a display substrate provided by one embodiment of the present disclosure after a blind groove is formed in an organic resin layer.

In some embodiments, the groove 31 may be a blind groove with a depth smaller than a thickness of the flattening layer 3, such as a blind groove 71 shown in FIG. 6.

In some other embodiments, as shown in FIG. 4, the groove 31 may be a through groove penetrating through the flattening layer 3 in a thickness direction of the flattening layer 3.

In some embodiments, as show in FIG. 3, the groove 31 may include an annular body portion 311 and a plurality of protruding portions 312 protruding relative to a side wall of the annular body portion 311, and an orthographic projection of the protruding portions 312 on the base substrate is on a side, facing an orthographic projection of the channel area 230 on the base substrate, of an orthographic projection of the annular body portion 311 on the base substrate, in other words, the protruding portions 312 are on an inner side of the annular body portion 311.

It's worth noting that the 'annular body portion 311' and the 'protruding portions 312' are a part of the groove 31, and are essentially groove bodies, the 'annular body portion 311' is an annular groove body, and the 'protruding portions 312' are groove bodies in an inner side wall of the annular groove body.

Specifically, the protruding portions 312 are additionally arranged on the annular body portion so that the area of aside wall of the groove 31 can be increased, release paths of the Outgas from the flattening layer are increased, and diffusion of the Outgas to the channel area of the TFT is reduced.

In some embodiments, as shown in FIG. 1 and FIG. 4, the thin film transistor 2 include source and drain electrodes 24, the flattening layer 3 further include a first via hole 32 for exposing the source and drain electrodes 24, and the first via hole 32 can be used for electrical connection between the pixel electrode 6 and the source and drain electrodes 24.

Exemplarily, as shown in FIG. 1 and FIG. 4, the groove 31 in the flattening layer 3 communicates with the first via hole 32. Of course, for example, as shown in FIG. 2, the groove 31 and the first via hole 32 also may be two independent structures, and do not communicate with each other. Forms can be determined according to actual requirements specifically.

Exemplarily, as shown in FIG. 1 and FIG. 4, a size of the first via hole 32 is larger than a width of the groove 31.

Specifically, the first via hole 32 is usually prepared through an exposure and development process, and as the flattening layer 3 is thick, the size of the first via hole 32 of the flattening layer 3 is usually large in order to prevent flattening layer material residues in the first via hole 32 caused by insufficient exposure. Exemplarily, the size of the first via hole 32 is usually larger than 7 μm, for example, the size of the first via hole may be 7 μm to 10 μm.

Specifically, a size of the groove 31 is designed to be small in order to prevent protection of the flattening layer 3 on the channel area 230 of the TFT 2 from being affected by the groove 31. Exemplarily, the size of the groove may be 1 μm to 5 μm, and furthermore, may be 1 μm to 3 μm, so that protection of the flattening layer 3 on the channel area 230 of the TFT 2 is not affected.

It needs to be noted that 'sizes' of the via hole or the groove, an opening and other structures involved in the present disclosure refer to radial sizes, and are associated with shapes of the structures. For example, a 'size' of a round via hole refers to a round diameter; a 'size' of a square via hole refers to a square diagonal; a size of a round or square groove (or opening) refers to a round diameter or a square diagonal; and a 'size' of a strip-shaped or annular groove refers to a width of a strip or an annulus.

In some embodiments, as shown in FIG. 1 and FIG. 4, the display substrate further includes a first electrode layer 4, the first electrode layer 4 is on a side, away from the base substrate 1, of the flattening layer 3, and includes a first portion 41 in the groove 31, the first portion 41 covers a bottom of the groove 31 and exposes a side wall of the groove 31, in other words, the first portion 41, in the groove 31, of the first electrode layer 4 and other portions of the first electrode layer 4 are disconnected on the side wall of the groove 31, so that the Outgas from the flattening layer 3 can diffuse outside from the side wall of the groove 31, and diffusion of the Outgas to the channel area 230 of the TFT 2 is reduced.

In some embodiments, as shown in FIG. 4, an angle of gradient of the side wall of the groove 31 is larger than 80 degrees. As the angle of gradient of the side wall of the groove 31 is steep, coverage on the side wall of the groove 31 is poor when preparing the film through a magnetron sputtering film forming mode, and the first portion 41, in the groove 31, of the first electrode layer 4 and other portions of the first electrode layer are easily disconnected on the side wall of the groove 31.

Exemplarily, the display substrate provided by the embodiment of the present disclosure may be an array substrate of a liquid crystal display panel (LCD), the first electrode layer 4 may be a common electrode layer, and a material of the first electrode layer 4 is transparent indium tin oxide (ITO).

In some embodiments, as shown FIG. 4, the display substrate further includes a first inorganic insulating layer 51, and the first inorganic insulating layer 51 is on a side, away from the base substrate 1, of the first electrode layer 4, and covers the bottom and the side wall of the groove 31.

Specifically, the first inorganic insulating layer 51 may be used as a passivation layer, may be selected from a silicon nitride material with high water vapor isolating capacity, and is used for protecting the first electrode layer 4.

The size of the groove 31 is small, the groove is further covered with the first inorganic insulating layer 51 for protection, the external water vapor does not easily enter the flattening layer 3 through the groove 31, and therefore protection of the flattening layer 3 on the channel area 230 of the TFT 2 cannot be affected.

In some embodiments, as shown in FIG. 4, the display substrate further includes a second inorganic insulating layer 52, and the second inorganic insulating layer 52 is between the TFT 2 and the flattening layer 3 and used for covering and protecting the TFT 2. Exemplarily, a material of the second inorganic insulating layer 52 may be silicon oxide, and also can be prepared from silicon oxide/silicon nitride and the like through multi-layer recombination.

Specifically, a second via hole 50 penetrating through the first inorganic insulating layer 51 and the second inorganic insulating layer 52 is further embedded into the first via hole 32.

Furthermore, as shown in FIG. 1, the first electrode layer 4 is provided with an opening 40 for exposing the first via hole, and a size of the opening 40 is larger than the size of the first via hole 32.

Furthermore, as shown in FIG. 1 and FIG. 4, the display substrate further includes the pixel electrode 6, and the pixel electrode 6 is on a side, away from the first electrode layer 4, of the first inorganic insulating layer 51 and electrically connected with the source and drain electrodes 24 through the first via hole 32 and the second via hole 50. Exemplarily, a material of the pixel electrode 6 may be transparent ITO.

In some embodiments, in the display substrate provided by the present disclosure, the thin film transistor 2 includes an active layer 23, the active layer 23 may adopt an oxide semiconductor, such as indium gallium zinc oxide (IGZO), and of course, a material of the active layer 23 is not limited herein, and may be other materials with component characteristics easily affected by the Outgas.

Specifically, as shown in FIG. 1 and FIG. 4, in the display substrate provided by the present disclosure, the thin film transistor 2 further includes a gate electrode (Gate) 21 and a gate electrode insulating layer (GI) 22. Exemplarily, the thin film transistor 2 may include the gate electrode (Gate) 21, the gate electrode insulating layer (GI) 22, the oxide semiconductor active layer (Active) 23 and the metal source and drain electrodes (SD) 23 which are sequentially arranged in a direction away from the base substrate 1. A material of the Gate electrode may be selected from common metal materials such as Al, Cu, Au, Ag, Ti and Ta, and in order to prevent the oxide semiconductor active layer (such as IGZO) from being damaged by SD electrode etching liquid, the SD electrodes may be selected from multi-layer composite structures, such as Mo/Cu/Mo, MoNb/Cu/MoNb and the like.

It needs to be noted that the display substrate provided by the present disclosure is not limited to be used as an array substrate, also can be used as a drive backboard of an OLED, wherein the first electrode layer also may be a pixel electrode (anode), and the first inorganic insulating layer also may be a pixel defining structure and the like, which is not limited herein.

The present disclosure further provides a display panel. The display panel includes the display substrate. Specifically, the groove in the flattening layer is in a non-open area of the display panel. Specifically, the non-open area of the display panel is an area of the display panel except for an open area of the display panel, usually the open area is limited in the display panel though a shielding layer, and the non-open area can be an area which is shielded by the shielding layer and does not emit light.

Specifically, as shown in FIG. 1, the groove 31 is around the channel area 230 of the TFT and in the non-open area, the size of the groove is small, and therefore an opening rate of the display panel cannot be affected.

Exemplarily, the display panel is an LCD, and the display substrate is the array substrate.

Or, the display panel is the OLED, and the display substrate is the drive backboard.

The present disclosure further provides a display device. The display device includes the display panel.

Specifically, the display device may be applied to various kinds of electronic equipment such as televisions, displays, tablet computers and smart phones.

Figure 11:
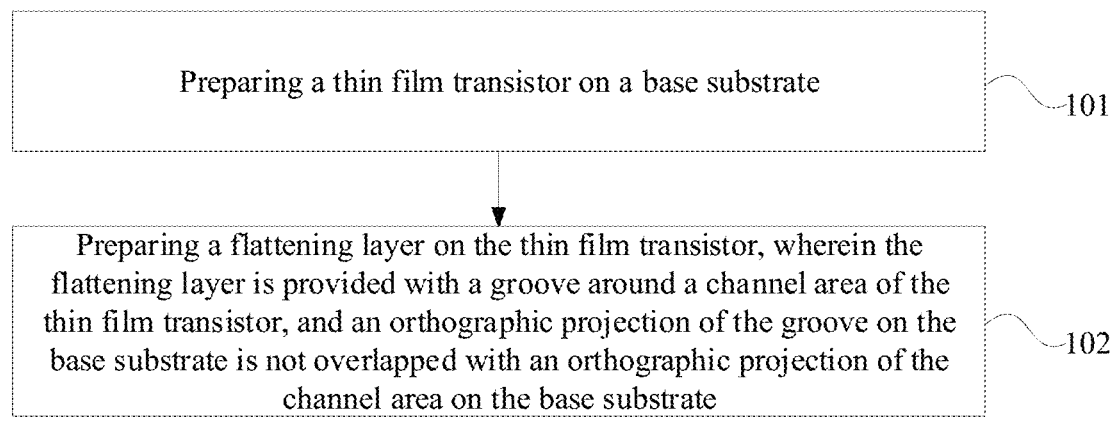
FIG. 11 is a flow diagram of a preparation method of a display substrate, provided by one embodiment of the present disclosure.

In addition, based on the display substrate provided by the present disclosure, the present disclosure further provides a preparation method of the display substrate. As shown in FIG. 11, the method includes the following steps.

S101, a thin film transistor is prepared on the base substrate.

S102, a flattening layer is prepared on the thin film transistor, wherein the flattening layer is provided with a groove around a channel area of the thin film transistor, and an orthographic projection of the groove on the base substrate is not overlapped with an orthographic projection of the channel area on the base substrate.

In some embodiments, S102, preparing the flattening layer on the thin film transistor, specifically may include the following steps.

Figure 5:
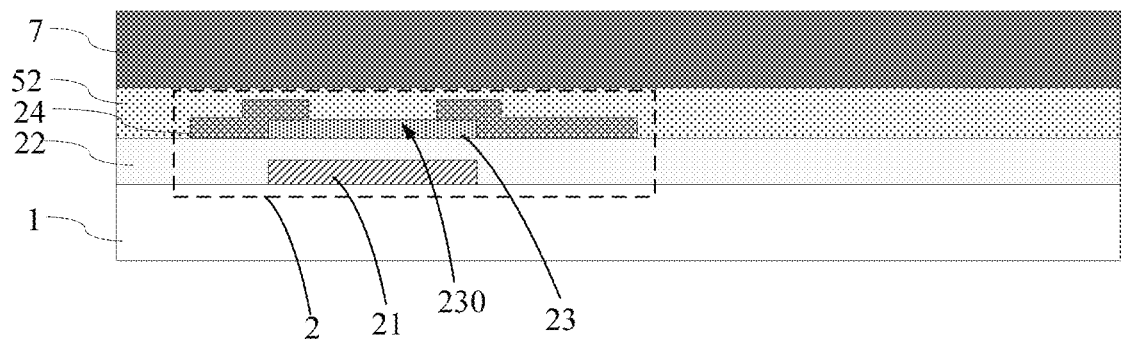
FIG. 5 is a schematic diagram of part of a cross-section structure of a display substrate provided by one embodiment of the present disclosure after an organic resin layer is formed.

S201, as shown in FIG. 5, the thin film transistor is coated with an organic resin layer; and exemplarily, a thickness of the organic resin layer 7 may be 2 μm to 5 μm.

S202, as shown in FIG. 6, an annular blind groove 71 surrounding the channel area 230 of the thin film transistor 2 is formed in the organic resin layer 7 through an exposure and development process; exemplarily, a ratio of a depth of the blind groove 71 to a thickness of the organic resin layer is larger than 1/2, for example, a width of the blind groove 71 may be 1 μm to 5 μm, and furthermore, the width of the blind groove may be 1 μm to 3 μm.

Figure 7:
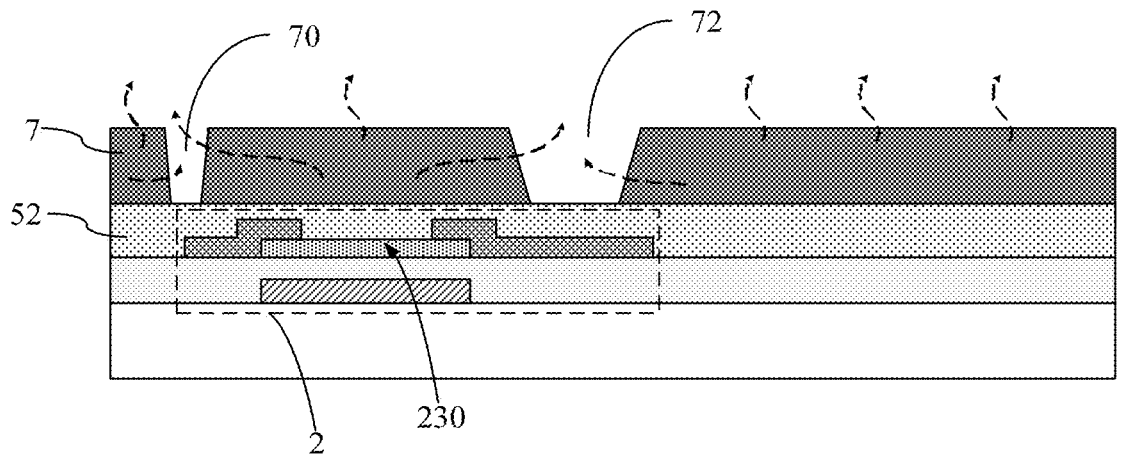
FIG. 7 is a schematic diagram of part of a cross-section structure of a display substrate provided by one embodiment of the present disclosure after a through groove is formed in an organic resin layer.

S203, as shown in FIG. 7, the organic resin layer 7 is treated through an ashing process, and the blind groove 71 becomes a through groove 70 penetrating through the organic resin layer 7 in a thickness direction of the organic resin layer 7.

Specifically, the organic resin layer 7 is a photosensitive material, may be used as photoresist, and may be directly treated through exposure, development, ashing and other processes.

In some embodiments, S101, preparing the thin film transistor on the base substrate, specifically includes: as shown in FIG. 5, an active layer 23 and source and drain electrodes 24 are sequentially prepared on the base substrate 1.

Furthermore, as shown in FIG. 5, S101, in a step of preparing the thin film transistor 2 on the base substrate 1, and before preparing the active layer 23, a step of sequentially manufacturing a gate electrode (Gate) 21 and a gate electrode insulating layer (GI) 22 is further included. Between S101 and S102, there may be a step of preparing a second inorganic insulating layer 52 on the thin film transistor 2. These all belong to conventional technological processes, which is omitted herein.

Furthermore, S102, preparing the flattening layer on the thin film transistor, specifically may include: as shown in FIG. 6, the blind groove 71 is formed in the organic resin layer 7 through the exposure and development process, and meanwhile a first via hole 72 for exposing the source and drain electrodes 24 is formed in the organic resin layer 7; exemplarily, a ratio of the width of the blind groove 71 to a size of the first via hole 72 ranges from 1/10 to 1/2; and for example, the width of the blind groove 71 may be 1 μm to 5 μm, for example, the width of the blind groove may be 1 μm to 3 μm, and the size of the first via hole 72 may be 7 μm to 10 μm. The blind groove 71 and the first via hole 72 are formed in the organic resin layer 7 at the same time through a single patterning process, or in other words, the blind groove 71 surrounding the channel area 230 of the TFT 2 is formed while the first via hole 72 in the organic resin layer 7 is formed through the patterning process, thus, the blind groove 71 can be formed without increasing any process step, a preparation process can be effectively simplified, and cost is reduced.

Specifically, under normal conditions, in order to enable surface flatness of the finally-formed flattening layer to be better, and meanwhile enable film layer residues in the first via hole 72 to be completely removed, the organic resin layer 7 is subjected to ashing usually, and coating of an electrode layer is conducted after ashing is completed. In the present disclosure, by means of an ashing process for the organic resin layer 7, the organic resin film layer in the blind groove 71 is completely etched away, the blind groove 71 becomes a through groove 70 penetrating through the organic resin layer 7 in the thickness direction of the organic resin layer 7, as shown in FIG. 7, thus, the area of the side wall of the finally-formed groove is large, the diffusion area and release paths of the Outgas from the organic resin layer 7 can be increased, thus, diffusion of the Outgas to the channel area 230 of the TFT 2 is reduced, and the influence of the Outgas to the channel area 230 of the TFT 2 is reduced. In addition, the structure of the through groove 70 with a small size and a large angle of gradient of the side wall is easily prepared through the ashing process, then influences of the through groove 70 (namely the groove) on the whole organic resin layer 7 (namely the flattening layer) is reduced, meanwhile, the electrode layer (such as the first electrode layer 4 in FIG. 8) covering the organic resin layer 7 is easily disconnected on the side wall of the through groove, and it is guaranteed that the Outgas can diffuse outside through the side wall of the through groove 70.

Of course, residual organic resin materials in the blind groove cannot be completely etched away, residues of an organic resin material can exist in the groove, or in other words, the finally-formed groove in the flattening layer may be a blind groove structure, the release paths of the Outgas can be increased, and diffusion of the Outgas to the channel area of the TFT is reduced.

Specifically, as the organic resin layer is thick, in order to prevent the organic resin material residues in the first via hole caused by insufficient exposure, the size of the first via hole is usually large. Exemplarily, the size of the first via hole is larger than 7 μm, for example, the size of the first via hole may be 7 μm to 10 μm.

Specifically, in order to prevent protection of the organic resin layer on the channel area of the TFT from being affected by the through groove, a size of the through groove is designed to be small. Exemplarily, the size of the through groove may be 1 μm to 5 μm, for example, the size of the through groove may be 1 μm to 3 μm, and thus, protection of the organic resin layer on the channel area of the TFT cannot be affected.

In the exposure process, as shown in FIG. 6, as the thickness of the organic resin layer 7 is thick and the size of the groove (blind groove 71) needing to be formed is small (approximately controlled at 1 μm to 3 μm), the material of the organic resin layer Tat the bottom cannot be fully sensitive to light during exposure due to the influence of exposure machine precision, the organic resin material residues exist at the bottom of the groove 31 after development, and thus, the blind groove 71 with the depth smaller than the thickness of the organic resin layer is prepared.

Specifically, S102, preparing the flattening layer on the thin film transistor, further may include a step of annealing the organic resin layer 7. Exemplarily, annealing is conducted for 30 min at high temperature of 250° C. in an air atmosphere. During annealing, the reductive gas (Outgas) such as the water vapor in the organic resin layer 7 can be released outside. In the present disclosure, as the through groove 70 surrounding the channel area 230 of the TFT 2 is arranged in the organic resin layer, the release paths of the Outgas can be increased, as shown in FIG. 7, the water vapor in the organic resin layer 7 above the channel area 230 of the TFT 2 can be released outside through the side wall of the through groove 70, and therefore the situation that the Outgas diffuses downwards to adversely affects the channel area 230 of the TFT 2 is avoided.

In some embodiments, S203, treating the organic resin layer through the ashing process, specifically includes: plasma etching equipment is used for etching the organic resin layer through bombardment with $O_2$ as working gas, so that the organic resin layer residues at the bottom of the blind groove are removed.

As shown in FIG. 7, ashing is conducted through $O_2$ plasma, damage to a second inorganic insulating layer 52 below the organic resin layer 7 can be reduced, and the through groove 70, the angle of gradient of the side wall of which is steep, is more easily manufactured when the plasma etching equipment is used for etching the residues at the bottom of the blind groove through the $O_2$ plasma. Exemplarily, the angle of gradient of the side wall of the through groove 70 can be larger than 80 degrees.

Specifically, by the adoption of the ashing process, the residues at the bottom of the blind groove can be completely etched away, and if film layer residues exist in the first via hole, the film layer residues can be completely removed.

Specifically, in the embodiments of the present disclosure, no procedure needs to be additionally arranged in the preparation process for the groove, a preparation process is simple, and cost is low.

In some embodiments, after S102, in other words, after preparing the flattening layer on the thin film transistor, the method further may include the following steps.

Figure 8:
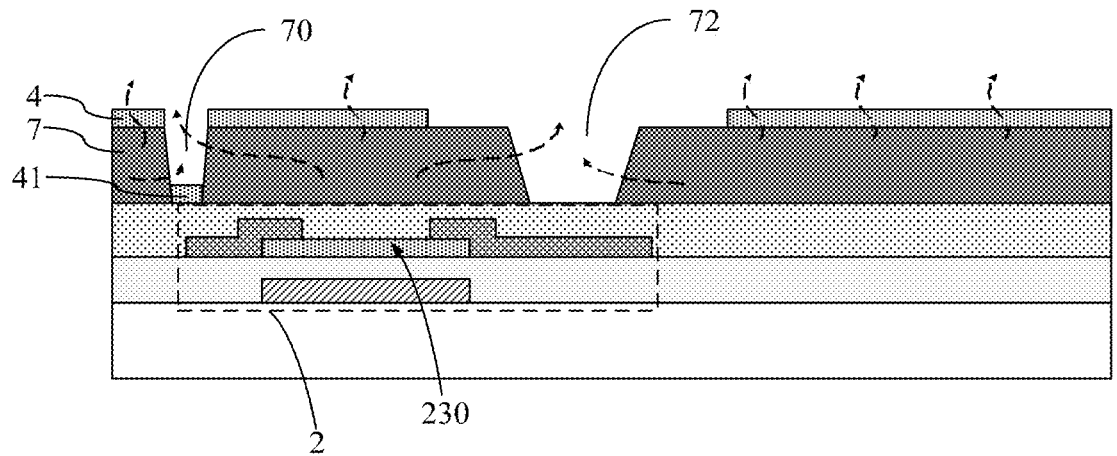
FIG. 8 is a schematic diagram of part of a cross-section structure of a display substrate provided by one embodiment of the present disclosure after a first electrode layer is formed.

S103, as shown in FIG. 8, the first electrode layer 4 is prepared on the flattening layer (namely the organic resin layer 7) through magnetron sputtering, the first electrode layer 4 includes the first portion 41 in the groove (namely the through groove 70), and the first portion 41 covers the bottom of the groove (namely the through groove 70) and exposes the side wall of the groove (namely the through groove 70).

As shown in FIG. 8, as the gradient of the side wall of the through groove 70 is steep, coverage of the side wall of the through groove 70 through the magnetron sputtering film forming mode is poor, the first electrode layer 4 prepared through magnetron sputtering is disconnected on the side wall of the through groove 70, and the first portion 41 in the through groove and the other portions located outside the through groove 70 are formed.

Exemplarily, a material of the first electrode layer 4 may be a transparent ITO material. Specifically, in order to reduce crystal defects of the first electrode layer 4, the first electrode layer 4 needs to be annealed at high temperature, and specific conditions may include: treatment for 30 min at high temperature of 230° C. in an N2 atmosphere. In the annealing technological process, the reductive Outgas such as the water vapor in the organic resin layer 7 is released outside. In the present disclosure, as the through groove 70 surrounding the channel area 230 of the TFT 2 is arranged in the organic resin layer, the side wall of the through groove 70 is exposed by the first electrode layer 4, as shown in FIG. 8, the reductive Outgas from the organic resin layer 7 can be released outside through the side wall of the through groove 70, and the situation that the Outgas diffuses downwards to adversely affect the channel area 230 of the TFT 2 is avoided.

In some embodiments, after S103, in other words, after preparing the first electrode layer on the flattening layer through magnetron sputtering, the method further may include the following steps.

Figure 9:
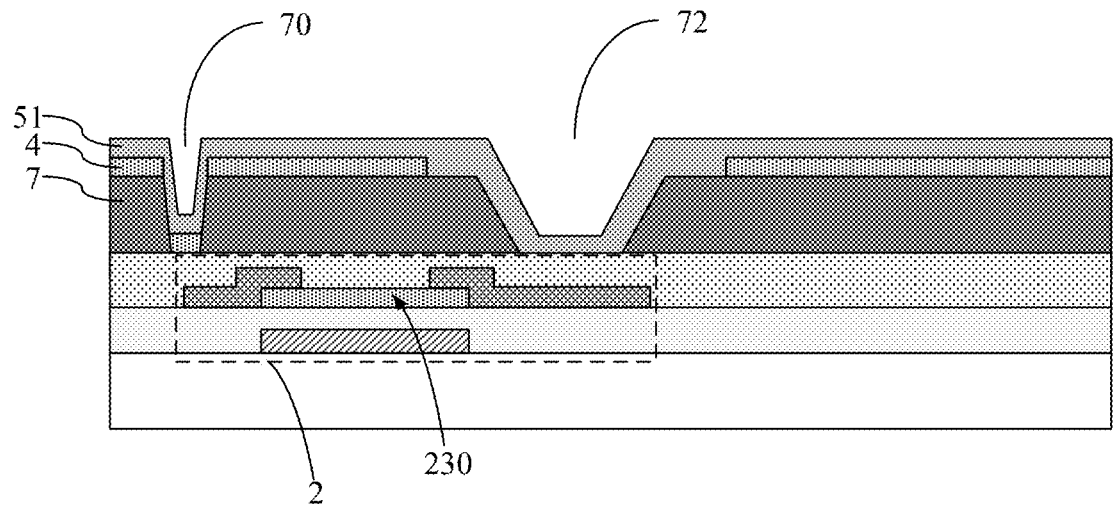
FIG. 9 is a schematic diagram of part of a cross-section structure of a display substrate provided by one embodiment of the present disclosure after a second inorganic insulating layer is formed.

S104, as shown in FIG. 9, the first inorganic insulating layer 51 is prepared on the first electrode layer 4 through PECVD, and the first inorganic insulating layer covers the bottom and the side wall of the groove (namely the through groove).

As shown in FIG. 9, coverage of the side wall of the through groove 70 is good through the PECVD film forming mode, the through groove 70 can be completely covered with a portion, in the through groove 70, of the first inorganic insulating layer 51 formed through the PECVD mode, and therefore the external water vapor can be prevented from invading the organic resin layer 7 through the through groove 70 to affect the channel area 230 of the TFT 2.

Exemplarily, the first electrode layer 4 may be a common electrode, and the first inorganic insulating layer 51 is used for protecting the first electrode layer 4.

Figure 10:
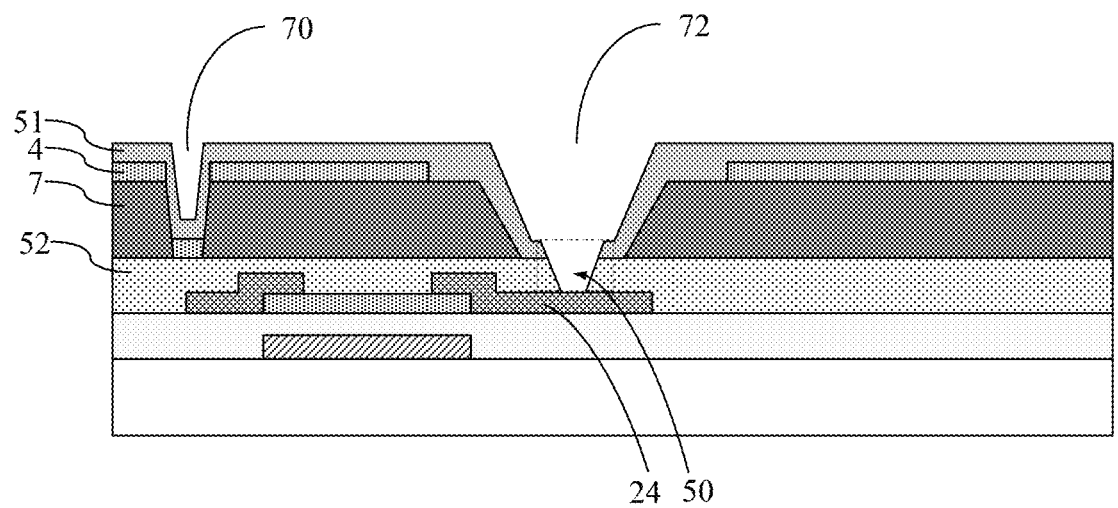
FIG. 10 is a schematic diagram of part of a cross-section structure of a display substrate provided by one embodiment of the present disclosure after a second via hole penetrating through a first inorganic insulating layer and a second inorganic insulating layer is formed.

Specifically, the preparation method provided by the embodiment of the present disclosure further may include the following steps: as shown in FIG. 10, the second via hole 50 penetrating through the first inorganic insulating layer 51 and the second inorganic insulating layer 52 is manufactured through photo-etching, etching and other technological processes, the second via hole 50 is embedded into the first via hole 72 in the organic resin layer 7, and an upper surface of the SD electrodes 24 is exposed by a bottom of the second via hole 50.

Furthermore, as shown in FIG. 4, the preparation method provided by the embodiment of the present disclosure further may include a step of preparing the pixel electrode 6 on the first inorganic insulating layer 51. Specifically, the pixel electrode 6 is electrically connected with the SD electrodes 23 through the first via hole (namely the first via hole 72 in the organic resin layer 7) and the second via hole 50 penetrating through the first inorganic insulating layer 51 and the second inorganic insulating layer 52.

Exemplarily, the pixel electrode 6 may adopt the transparent ITO material, and specifically may be a comb-shaped electrode layer.

Exemplarily, the preparation process of the preparation method of the display substrate provided by the embodiment of the present disclosure may include: as shown in FIG. 4, the gate electrode (Gate) 21, the gate electrode insulating layer (GI) 22, the oxide semiconductor active layer (Active) 23 and the metal source and drain electrodes (SD) 24 are sequentially manufactured on the base substrate 1, the second inorganic insulating layer 52 is prepared, the flattening layer 3 (provided with the groove 31) is prepared, the first electrode layer 4 (common electrode layer) is prepared, the first inorganic insulating layer 51 is prepared, and the second electrode layer 6 (pixel electrode layer) is prepared.

It needs to be noted that in some embodiments of the present disclosure, the preparation method of the display substrate further may include more steps, which is determined according to actual requirements and not limited by the embodiments of the present disclosure, and detailed descriptions and technical effects can refer to descriptions about the display substrate and the display panel above, which is omitted herein. In addition, in the preparation method provided by the embodiment of the present disclosure, the technological process about 'preparing the flattening layer on the thin film transistor' is not limited in the embodiment, the flattening layer with the groove can be prepared through other modes and steps, and the specific condition can refer to descriptions about the flattening layer and the groove structure above, which is omitted herein.

Obviously, those skilled in the art can perform various kinds of changes and modifications on the embodiments of the present disclosure without departing from the spirit and scope of the present disclosure. Thus, if the change and modification of the present disclosure belong to the claims of the present disclosure and the range of their equivalent technologies, the present disclosure also intends to include the change and modification.

What is claimed is:

1. A display substrate, comprising:
    a base substrate;
    a thin film transistor on the base substrate;
    a flattening layer on a side, away from the base substrate, of the thin film transistor, provided with a groove around a channel area of the thin film transistor, wherein an orthographic projection of the groove on the base substrate is not overlapped with an orthographic projection of the channel area on the base substrate;
    a first electrode layer on a side, away from the base substrate, of the flattening layer, wherein the first electrode layer comprises a first portion in the groove, and the first portion covers a bottom of the groove and exposes a side wall of the groove; and
    a first inorganic insulating layer on a side, away from the base substrate, of the first electrode layer, wherein the first inorganic insulating layer covers the bottom and the side wall of the groove.

2. The display substrate according to claim 1, wherein the groove is an annular groove surrounding the channel area.

3. The display substrate according to claim 2, wherein the groove comprises an annular body portion and a plurality of protruding portions protruding relative to a side wall of the annular body portion, and an orthographic projection of the protruding portions on the base substrate is on a side, facing the orthographic projection of the channel area on the base substrate, of an orthographic projection of the annular body portion on the base substrate.

4. The display substrate according to claim 2, wherein the thin film transistor comprises source and drain electrodes, and the flattening layer further comprises a first via hole for exposing the source and drain electrodes;
    the groove communicates with the first via hole; and a size of the first via hole is larger than a width of the groove.

5. The display substrate according to claim 2, wherein a width of the groove is 1μm to 3μm.

6. The display substrate according to claim 1, wherein the groove comprises a plurality of sections of groove bodies which surround the channel area and are sequentially arranged at intervals, and the plurality of sections of groove bodies are sequentially adjacent end to end without connecting with each other.

7. The display substrate according to claim 1, wherein the groove is a blind groove with a depth smaller than a thickness of the flattening layer.

8. The display substrate according to claim 1, wherein the groove is a through groove penetrating through the flattening layer in a thickness direction of the flattening layer.

9. The display substrate according to claim 1, wherein an angle of gradient of the side wall of the groove is larger than 80 degrees.

10. A display panel, comprising the display substrate according to claim 1, wherein the groove is in a non-open area of the display panel.

11. A preparation method of a display substrate, comprising:
    preparing a thin film transistor on a base substrate;
    preparing a flattening layer on the thin film transistor, wherein the flattening layer is provided with a groove around a channel area of the thin film transistor, and an orthographic projection of the groove on the base substrate is not overlapped with an orthographic projection of the channel area on the base substrate;
    preparing a first electrode layer on the flattening layer, wherein the first electrode layer comprises a first portion in the groove, and the first portion covers a bottom of the groove and exposes a side wall of the groove; and
    preparing a first inorganic insulating layer on the first electrode layer, wherein the first inorganic insulating layer covers the bottom and the side wall of the groove.

12. The preparation method according to claim 11, wherein the preparing the flattening layer on the thin film transistor comprises:
    coating the thin film transistor with an organic resin layer;
    forming the groove, surrounding the channel area of the thin film transistor, in the organic resin layer through an exposure and development process, wherein a ratio of a depth of the groove to a thickness of the organic resin layer is larger than 1/2, the groove is annular and is a blind groove; and
    treating the organic resin layer through an ashing process to cause the blind groove to become a through groove penetrating through the organic resin layer in a thickness direction of the organic resin layer.

13. The preparation method according to claim 12, wherein the preparing the thin film transistor on the base substrate comprises:
    sequentially preparing an active layer and source and drain electrodes on the base substrate; and
    the preparing the flattening layer on the thin film transistor, further comprises:
    forming the blind groove in the organic resin layer through the exposure and development process, and meanwhile forming a first via hole, for exposing the source and drain electrodes, in the organic resin layer, wherein a ratio of a width of the blind groove to a size of the first via hole ranges from 1/10 to 1/2.

14. The preparation method according to claim 12, wherein the treating the organic resin layer through the ashing process comprises:
    etching the organic resin layer by plasma etching equipment through bombardment with $O_2$ as working gas, so that organic resin layer residues at a bottom of the blind groove are removed.

15. The preparation method according to claim 11, wherein the preparing the first electrode layer on the flattening layer comprises:
    preparing the first electrode layer on the flattening layer through magnetron sputtering.

16. The preparation method according to claim 11, wherein the preparing the first inorganic insulating layer on the first electrode layer comprises:
    preparing the first inorganic insulating layer on the first electrode layer through a plasma enhanced chemical vapor deposition (PECVD) mode.

* * * * *

UNITED STATES PATENT AND TRADEMARK OFFICE
CERTIFICATE OF CORRECTION

| | | |
|---|---|---|
| PATENT NO. | : 12,057,457 B2 | Page 1 of 1 |
| APPLICATION NO. | : 17/418218 | |
| DATED | : August 6, 2024 | |
| INVENTOR(S) | : Kui Gong | |

It is certified that error appears in the above-identified patent and that said Letters Patent is hereby corrected as shown below:

On the Title Page

Item (86) should read:
§ 371(c)(1),(2) Date: Jun. 24, 2021

Item (30) should read:
Foreign Application Priority Data
Mar. 5, 2020 (CN).......................202010146623.5

Signed and Sealed this
Twenty-fifth Day of February, 2025

Coke Morgan Stewart
*Acting Director of the United States Patent and Trademark Office*